(12) United States Patent
Warnock et al.

(10) Patent No.: US 7,084,462 B1
(45) Date of Patent: Aug. 1, 2006

(54) PARALLEL FIELD EFFECT TRANSISTOR STRUCTURE HAVING A BODY CONTACT

(75) Inventors: James D. Warnock, Somers, NY (US); George E. Smith, III, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/907,796

(22) Filed: Apr. 15, 2005

(51) Int. Cl.
*H01L 31/0392* (2006.01)

(52) U.S. Cl. ........................ 257/348; 438/151

(58) Field of Classification Search ................ 257/347, 257/350, 352; 438/151, 153, 154
See application file for complete search history.

(56) References Cited

U.S. PATENT DOCUMENTS

| | | | |
|---|---|---|---|
| 5,185,280 A | 2/1993 | Houston et al. | |
| 5,298,773 A | 3/1994 | Woodruff | |
| 5,317,181 A | 5/1994 | Tyson | |
| 5,811,855 A | 9/1998 | Tyson et al. | |
| 5,821,769 A | 10/1998 | Douseki | |
| 6,154,091 A | 11/2000 | Pennings et al. | |
| 6,177,708 B1 | 1/2001 | Kuang et al. | |
| 6,310,377 B1 | 10/2001 | Maeda et al. | |
| 6,387,739 B1 | 5/2002 | Smith, III | |
| 6,433,587 B1 | 8/2002 | Assaderaghi et al. | |
| 2001/0041393 A1 | 11/2001 | Hargrove et al. | |
| 2002/0014664 A1 | 2/2002 | Mandelman et al. | |
| 2003/0132464 A1 | 7/2003 | Yamaguchi et al. | |

*Primary Examiner*—Sara Crane
(74) *Attorney, Agent, or Firm*—Lisa U. Jaklitsch (57) ABSTRACT

A first or primary field effect transistor ("FET") is separated from a body contact thereto by one or more second FETs that are placed electrically in parallel with the first FET. In this way, the body of the first FET can be extended into the region occupied by the second FET to allow contact to be made to the body of the first FET. In one embodiment, the gate conductor of the first FET and a gate conductor of the second FET are integral parts of a unitary conductive pattern. The unitary conductive pattern is made desirably small, and can be made as small as the smallest predetermined linewidth for gate conductors on an integrated circuit which includes the body-contacted FET. In this way, area and parasitic capacitance are kept small.

18 Claims, 5 Drawing Sheets

PARALLEL FIELD EFFECT TRANSISTOR STRUCTURE HAVING A BODY CONTACT

BACKGROUND OF THE INVENTION

The present invention relates to semiconductor device structures and processing methods, and more particularly to a field effect transistor structure ("FET") having a body contact.

Speed is a key aspect of operational performance of integrated circuits. In recent years, enhanced fabrication techniques including silicon-on-insulator (SOI) technology have been introduced. SOI technology is becoming increasingly important since it assists in lowering the capacitance of transistors, enabling greater switching speeds. FETs typically have a voltage-controlled source-drain conduction path extending between a source region, through a channel region and into a drain region of the FET. Another way that a FET can be considered is that each FET has two source/drain regions, one disposed at each end of the channel region, instead of making a distinction between the one source region and one drain region. When FETs are formed in bulk substrates, the junctions between the source/drain regions and the well region surrounding the transistor and between the well region and the body of the transistor (the portion of the transistor immediately below the gate including the transistor channel), result in significant capacitance. In SOI substrates, active devices such as field effect transistors ("FETs") are formed in a relatively thin single-crystal semiconductor layer overlying a buried layer of insulating material such as a buried oxide (BOX) layer. Most of the capacitance associated with the junctions between the source/drain regions and the surrounding well region is eliminated in a design including an SOI substrate, because the heavily-doped source/drain region is isolated from the substrate by the presence of the buried oxide. Moreover, with the presence of the BOX layer under the transistor body in the SOI design, and the gate dielectric on top, and the source and drain regions on the sides, the body of the SOI FET is, as a result, electrically isolated.

The electrically isolated body of a transistor having a conduction channel formed in an SOI substrate is known as a "floating body" because the body floats at a potential which varies according to various conditions in which the transistor is operated, wherein such potential is usually not known in advance. In consequence, the threshold voltage $V_T$ of the transistor is subject to variation, also to an extent that is usually not known in advance. The threshold voltage $V_T$ is the voltage at which an FET transitions from an 'off' state to an 'on' state. FETs are fabricated as either n-channel type FETs (NFETs) or p-channel type FETs (PFETs). Using the NFET as an example of an FET, the threshold voltage $V_T$ may be lowered, causing the NFET to turn on at too low a voltage, early within a switching cycle. This may cause an early or false detection signal for rising signal transitions. Conversely, for falling signal transitions, detection comes later than expected. In addition, a lower value of the low voltage is required to keep the subthreshold leakage current tolerably low. Alternatively, the threshold voltage $V_T$ may increase as a result of charge accumulation, causing the NFET to turn on late for rising signal transitions and early in the case of falling signal transitions.

While such variations in the threshold voltage are usually tolerable when the FET is used in a digital switching element such as an inverter or logic gate, FETs used for amplifying signals, especially small swing signals, need to have a stable threshold voltage.

One solution is to provide a body contact for the field effect transistor having a conduction channel disposed in an SOI substrate. A body contact is an electrically conductive contact made to the body of the transistor to provide, inter alia, a low-resistance path for the flow of charge carriers to and from the transistor body.

Figure 1:
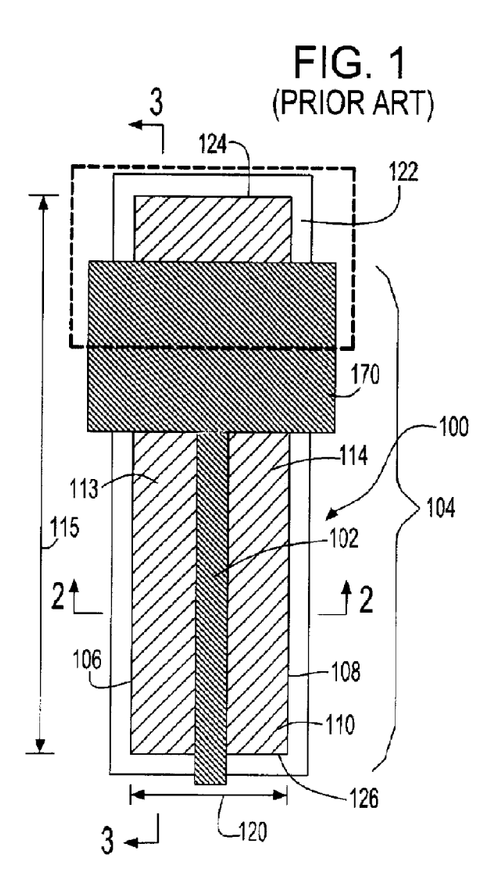
FIG. 1 is a top plan view illustrating a body-contacted SOI FET according to the prior art.

FIG. 1 is a plan view illustrating a prior art FET 100 having a conduction channel (not shown) formed in a SOI region of a substrate, the FET having a body contact. The particular SOI region in which the FET is formed is also referred to herein as an active area 110, as bounded by one or more isolation regions 122. As shown in FIG. 1, the FET 100 includes a conductor pattern 104 having a gate conductor portion 102 which extends in a direction of the length 115 of the active area 110. The gate conductor portion 102 divides the width 120 of the active area 110 into three parts: a source region 113 disposed between a left edge 106 of the active area and the gate conductor portion 102, a channel region (not shown) of the FET underlying the gate conductor portion 102, and a drain region 114 disposed between the gate conductor portion 102 and a right edge 108 of the active area 110.

Figure 2:
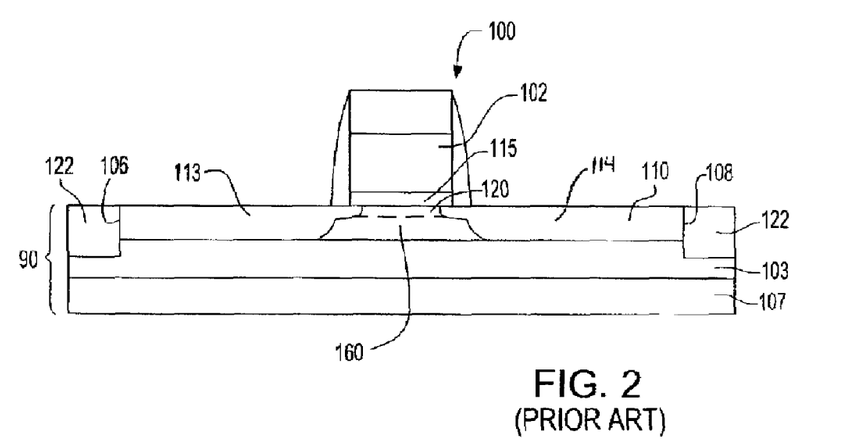
FIG. 2 is a sectional view through lines 2—2 of FIG. 1 illustrating a body-contacted SOI FET according to the prior art.

FIG. 2 is a sectional view of the SOI FET through line 2—2 of FIG. 1. As shown in FIG. 2, the body 160 of the FET 100 is disposed in an active area 110 of a semiconductor-on-insulator ("SOI") region such as a silicon-on-insulator layer of an SOI substrate 90. The active area 110 is bounded by one or more isolation regions 122 disposed at left and right edges 106, 108 of the active area 110, as well as at the top edge 124 and the bottom edge 126 of the active area (FIG. 1). The SOI region overlies a buried oxide ("BOX") layer 103, which insulates the SOI region from a bulk region 107 of the substrate 90. The body 160 of the FET is disposed under the gate conductor portion 102. A channel region 120 occupies a portion of the body 160 close to a gate dielectric 115 of the FET. The source region 113 and the drain region occupy portions of the active area 110 adjacent to the body 160. When the FET is properly biased to conduct by a voltage on the gate conductor 102, current flows across the channel region 120 between the source region 113 and the drain region 114 of the FET.

Figure 3:
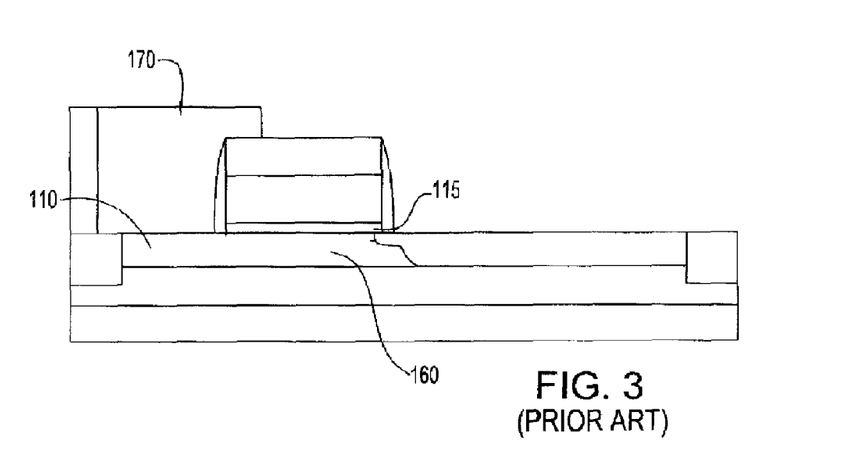
FIG. 3 is a sectional view through lines 3—3 of FIG. 1 illustrating a body-contacted SOI FET according to the prior art.

As shown in FIG. 3, a conductive body contact via 170 conductively contacts a portion of the active area 110 of the FET adjacent to the body 160 of the FET. In a particular example, the FET is an NFET in which the body has p-type doping. The NFET is turned on when a sufficient concentration of electrons accumulates to produce an inversion layer in the channel region 120 (FIG. 1) having n-type conductivity. In such NFET, the body contact has p+ doping in order to provide a conductive path to the p-type doped body 160 of the NFET. This differs from the n+ type doping used for the source region 113 and drain region 114 of the NFET 100 (FIGS. 1–2).

The use of body contacts is particularly advantageous in circuitry involving current sources, current mirror circuits or when used in conjunction with sense amplifiers when data signals need to be amplified. In addition, the body contact designs are used in partially depleted SOI FET devices in order to minimize the floating charge body effects.

However, despite the foregoing advantages of providing a field effect transistor with a body contact, transistor designs include body contacts sparingly because a body contact tends to increase the amount of substrate area that the FET occupies, as well as the capacitance between the gate conductor of the FET and the SOI layer under the gate. Each of these also tends to degrade the performance of the FET in a circuit.

The increase in surface area is best viewed in the top down depiction of FIG. 1, where the conductor pattern 104 includes the gate conductor portion 102 and a large body contact conductor portion 170 connected thereto. The large body contact conductor portion 170, being in capacitive contact with the active area, adds large parasitic capacitance. Moreover, since the area underlying of the large conductor portion 170 does not lie in the area between the source region and the drain region of the FET, the area is not used for driving the on current of the FET as it is for the area under the gate conductor portion 102. The increase in capacitance impacts the switching speed of the FET. The increased area of the large body contact conductor portion further impacts the switching speed of the FET by increasing the length of wiring to the FET. To counter the effects of increased capacitance, the drive current would need to be increased to maintain the original switching speed. Besides being difficult to accomplish, such would cause an undesirable increase in power dissipation.

Figure 4:
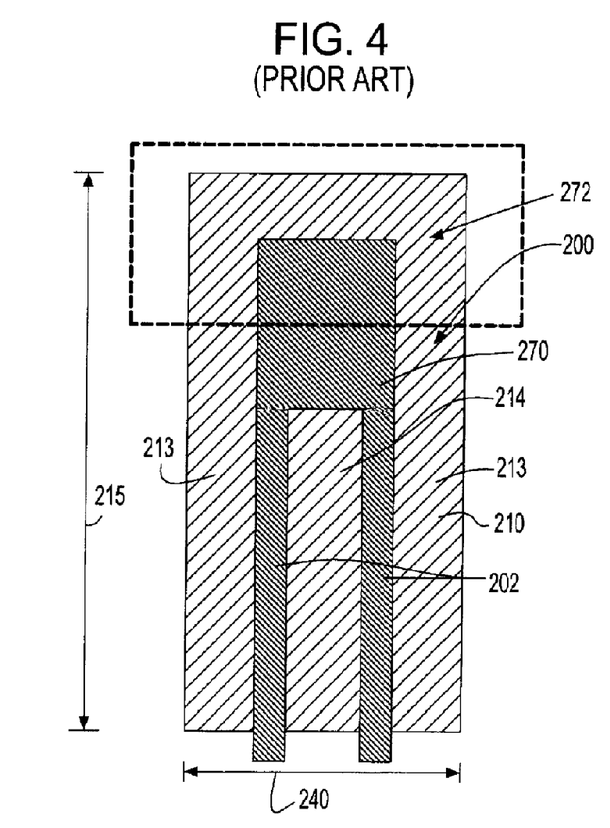
FIG. 4 is a top plan view illustrating a multi-fingered body-contacted SOI FET according to the prior art.

FIG. 4 is a plan view illustrating a different prior art body-contacted FET 200 in which a body contact conductor portion 270 of the gate conductor pattern has reduced area compared to the area of the body contact conductor portion 170 of FET 100 (FIG. 1). This FET 200 has two gate conductor fingers 202 which extend in a direction of the length 215 of an active area 210, and includes two source regions 213 which are separated from a common drain region 214 by the fingers. The two fingers 202 are placed parallel to each other, dividing the width 240 of the active area 210 into three parts, the two source regions 213 provided between the fingers 210 and the outer edges of the active area 210 and the drain 214 provided between the two fingers 202. The two-finger design of FET 200 is advantageous because it provides increased current drive over a one-finger design of FET 100 which occupies an active area having the same width as width 120 of FET 100 (FIG. 1).

In the prior art FET 200, the body contact conductor portion 270 does not separate the source regions 213 of the active area 210 from the body contact 272, as it did in the FET 100 (FIG. 1). As a result, the source regions 213 are not electrically isolated from the body contact 272. This limits the applications to which the FET 200 can be put, since the voltages applied to the source regions and the body contact must be kept the same, e.g., at ground.

Figure 5:
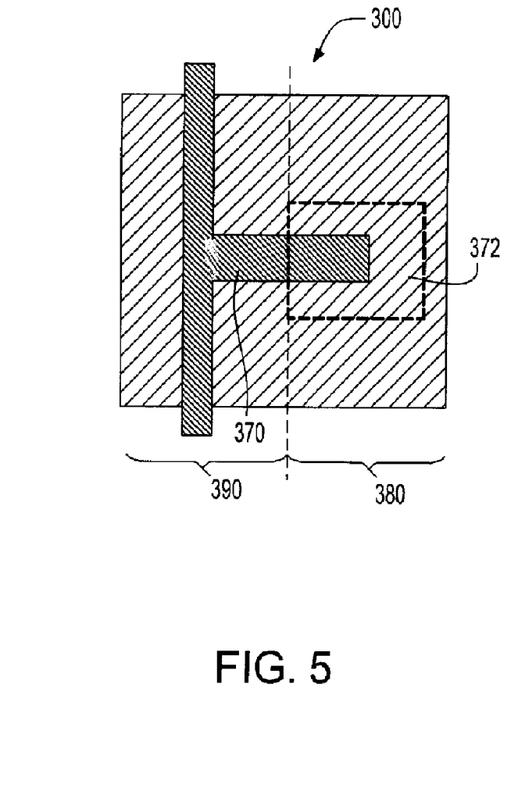
FIG. 5 is a top plan view illustrating yet another body-contacted SOI FET according to the prior art.

FIG. 5 shows another body-contacted FET 300 according to the prior art. In this FET 300, a body-contact portion 372 of the active area is implanted to p+ doping. This FET 300 has a design which has lowered parasitic capacitance in relation to FET 100 shown in FIG. 1, because the amount of the semiconductor area underlying the body-contact portion 370 of the conductor pattern is less than that shown in FIG. 1. However, the design shown in FIG. 5 is rarely used, because it requires a large amount of semiconductor area 380 to provide the body contact relative to the amount of semiconductor area 390 used to provide the active FET 300.

As mentioned above, one difficulty with the use of a body contact, whether the design shown in FIG. 1, FIG. 4 or FIG. 5 is used, is large parasitic capacitance. The large capacitance arises because of the close proximity between the body contact conductor portion 170 (FIG. 1), 270 (FIG. 4) or 370 (FIG. 5) and the single-crystal SOI region of the substrate across a portion of the gate dielectric layer 115 (FIG. 3).

Consequently, it would be desirable to provide an improved structure and fabrication method for providing a body-contacted FET having reduced parasitic capacitance.

SUMMARY OF THE INVENTION

The embodiments of the invention provided herein address the foregoing problems by separating a first or primary field effect transistor ("FET") from a body contact thereto by one or more second FETs that are placed electrically in parallel with the first FET. In this way, the body of the first FET can be extended into the region occupied by the second FET to allow contact to be made to the body of the first FET. Preferably, the gate conductor of the first FET and gate conductor of the second FET are integral parts of a unitary conductive pattern. Preferably, the unitary conductive pattern is made desirably small, and can be made as the smallest predetermined linewidth for gate conductors on an integrated circuit which includes the body-contacted FET. In this way, area and parasitic capacitance are kept small.

Thus, according to one aspect of the invention, a semiconductor device structure is provided which includes a unitary single-crystal semiconductor region of a substrate. A first field effect transistor ("FET") having a first source region and a first drain region is disposed in the unitary single-crystal region. The first source region and the first drain region define a first source-drain conduction path. At least one second field effect transistor ("FET") having a second source-drain conduction path is provided electrically in parallel with the first source-drain conduction path of the first FET. The second FET has a second diffusion region including at least one of a second source region and a second drain region. The second source-drain conduction path extends between the second diffusion region and one of the first source region and the first drain region. The body contact portion of the unitary single-crystal region is disposed such that it has a junction with the second diffusion region.

DETAILED DESCRIPTION

Figure 6:
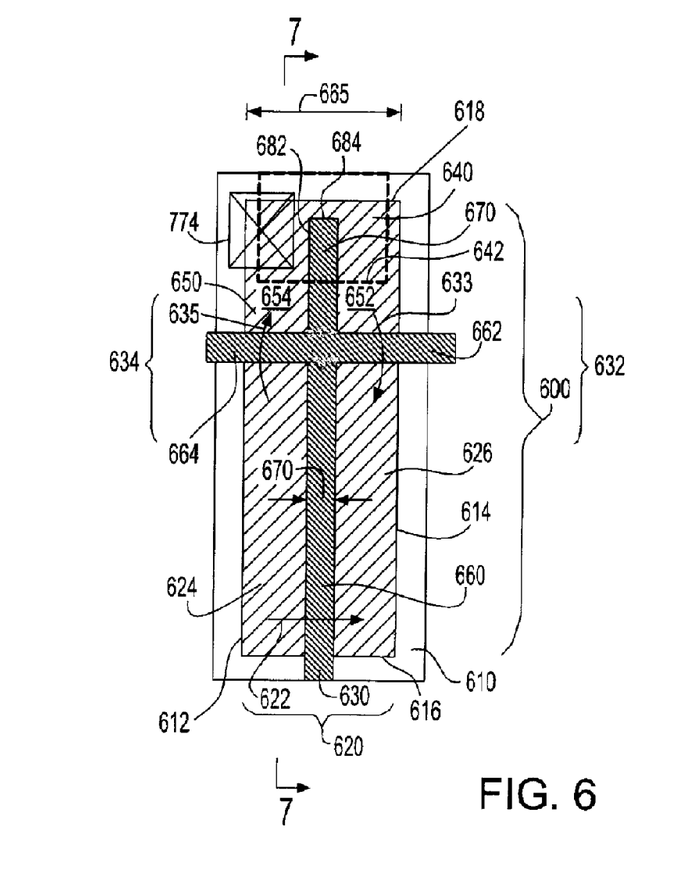
FIG. 6 is a top plan view illustrating a body-contacted SOI FET according to one embodiment of the present invention.

In accordance with the embodiments of the invention, a semiconductor device structure and fabrication method are provided which address the foregoing problems of body-contacted FETs. With reference to FIG. 6, in the semiconductor device structures described herein, a first field effect transistor (FET) 620 is disposed in a unitary single-crystal semiconductor region 600 of a substrate. A body contact 640 has a junction 642 to a diffusion region 650 of the unitary single-crystal region 600 that is not electrically tied to the source region 624 of the first FET or indeed to the drain region 626 of the first FET. Instead, the diffusion region 650 functions as at least one of a source region and a drain region of a second FET 632 and that of another second FET 634 having a source-drain conduction path to at least one of the first source region and first drain region of the first FET. In such way, the source-drain conduction path of the second FET is electrically connected in parallel with the source-drain conduction path of the first FET.

In the embodiment of the invention shown in FIG. 6, the unitary single-crystal semiconductor region 600 preferably consists essentially of silicon or consists essentially of an alloy of silicon, e.g., silicon germanium. Alternatively, the semiconductor region 600 has a portion consisting essentially of silicon and another portion consisting essentially of silicon germanium for the purpose of applying a stress to the channel region to increase the performance of the transistor. The unitary single-crystal region is optionally bounded by one or more regions of shallow trench isolation ("STI") 610 disposed at a bottom edge 616 and at a top edge 618 of the single-crystal region 600 and at a left edge 612 and at a right edge 614 of the unitary single-crystal semiconductor region 600. The unitary single-crystal region 600 is preferably provided in a semiconductor-on-insulator ("SOI") layer such as a silicon-on-insulator layer of an SOI substrate in which a buried oxide ("BOX") layer underlies the SOI layer and a bulk region of the substrate underlies the BOX layer, similar to the BOX layer and bulk region shown and described above with reference to FIG. 2.

The first FET 620 has a first source-drain conduction path 622 between a first source region 624 and a first drain region 626 in the unitary single-crystal semiconductor region 600. A body contact 640 has a junction 642 to a diffusion region 650 of the unitary single-crystal region 600 that is not electrically tied to the source region 624 of the first FET or indeed to the drain region 626 of the first FET. Instead, a portion of the diffusion region 650 functions as a source region 652 of a second FET 632 having a source-drain conduction path 633 to a drain region 626 of the first FET 620 which is in parallel with the source-drain conduction path 622 of the first FET. Similarly, a portion of the diffusion region 650 functions as a drain region 654 of another second FET 634 having a source-drain conduction path 635 to the source region 624 of the first FET 620 in parallel with the first FET.

As further shown in FIG. 6, the first FET and second FETs have gate conductors, respectively, provided as a first gate conductor portion 660, and second gate conductor portions 662, 664, respectively, which are conductively and physically joined together in one unitary conductive pattern. The first gate conductor portion 660 is oriented in a lengthwise direction of the unitary single-crystal region 600, i.e., the direction between the top and bottom edges 618, 616 of the unitary single-crystal region 600. The second gate conductor portions 662, 664 are oriented in a widthwise direction of the unitary single-crystal region, i.e., the direction of the width 665 between the left and right edges 612, 614 of the unitary single-crystal region. The unitary conductive pattern also includes a tail conductor 670 extending in the lengthwise direction from an edge of the second gate conductor portions 662, 664 towards the top edge 618 of the unitary conductive pattern.

Preferably, the second gate conductor portions 662, 664 of the unitary conductive pattern extend entirely across the width 665. This helps to assure that the diffusion region 650, in which portions of the second FETs 632, 634 are disposed, is electrically separate from the first FET 620. The first gate conductor portion 660 extends all the way from one edge of the second gate conductor portions 662, 664 to one edge of the unitary single-crystal semiconductor region 600, in this case the bottom edge 616.

According to a preferred embodiment, the unitary conductive pattern has a linewidth 670 which is not substantially greater than a predetermined smallest linewidth for gate conductors of the integrated circuit of which the semiconductor device structure forms a part. Preferably, the linewidth 670 of the unitary conductive pattern is equal to the smallest predetermined linewidth for the integrated circuit. Preferably, not only the first gate conductor portion 660, but the second gate conductor portions 662, 664 and the tail conductor portion 670 all have a linewidth equal to the smallest predetermined linewidth. Small linewidth facilitates high current drive through the first FET 620. Small linewidth also reduces the amount of the single-crystal semiconductor region underlying portions of the conductive pattern that is not utilized as a first gate conductor of the first FET, thus keeping parasitic capacitance low.

Referring further to FIG. 6, the body contact 640 is formed by implanting a somewhat heavily doped region into the unitary single-crystal semiconductor region through a corresponding opening. In order to assure a body contact of sufficient size and placement within tolerances, the opening may extend over a portion of the STI region 610, such that some of the implanted species are implanted into the STI region 610 when the body contact region is implanted. However, only the implanted portion of the unitary single-crystal semiconductor region 600 becomes a part of the body contact region of the structure.

Figure 7A:
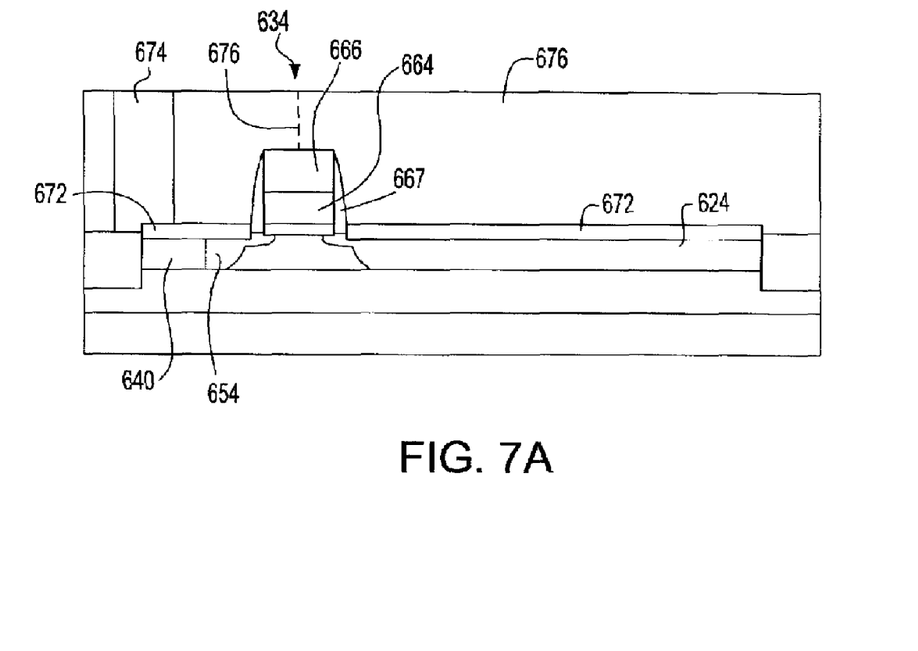
FIG. 7A is a corresponding sectional view through lines 7—7 of FIG. 6, illustrating the body-contacted SOI according to a particular embodiment of the present invention.

FIG. 7A is a sectional view through lines 7—7 of the semiconductor device structure shown in FIG. 6. As shown in FIG. 7A, the body contact region 640 of the single-crystal semiconductor region is adjacent to and forms a junction with the diffusion region 654. As described above, the second diffusion region 654 functions as a drain region for the second FET. The second FET 634 has a source-drain conduction path extending between the diffusion region 654 under the second gate conductor portion 664 to the source region 624 of the first FET. A silicide layer 672 overlies the SOI layer in which the body contact region 640, the second diffusion region 654 and the first source region 624 are disposed. The silicide layer 672 is preferably formed by depositing a silicide-forming metal onto the exposed single-crystal silicon material of the structure and then annealing to form the silicide 672 which is self-aligned to the single-crystal silicon region. An interlevel dielectric ("ILD") region 676 covers the semiconductor device structure including all the FETs, the body contact areas, and the diffusion regions. Contacts, such as conductive via 674 and other contacts (not shown) may be provided through openings in this dielectric layer as necessary to conductively contact desired portions of the device.

As also shown in FIG. 6, the second gate conductor portion 664 has an insulating cap 666 and insulating sidewall spacers 667, which together encapsulate the second gate conductor portion 664 for isolation from adjacent conductive features. While not particularly shown in FIG. 6, the insulating cap and sidewall spacers preferably encapsulate the entire unitary conductive pattern for isolation. With the insulating cap 664 and sidewall spacers 667 for isolation, a conductive via 674 can be provided in an opening extending through the ILD region 676 to conductively contact the silicide layer 672. Optionally, in a variation of the embodiment shown in FIG. 7B, the conductive via 674 may be formed in a borderless manner such that an edge 676 of the conductive via 674 falls on the insulating cap 666. Such a borderless contact is not required for the implementation of this invention. Alternatively, another more routine contact scheme can be used instead, such as that described in the following relative to FIG. 7B.

Figure 7B:
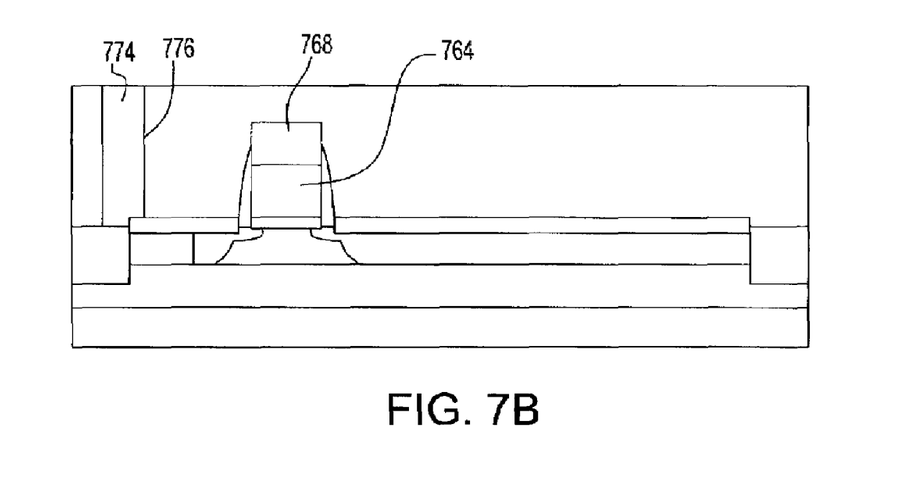
FIG. 7B is a corresponding sectional view through lines 7—7 of FIG. 6, illustrating the body-contacted SOI according to a variation of such embodiment of the present invention.

FIG. 7B shows another variation of the semiconductor device structure described relative to FIG. 7A. In this structure, a silicide layer 768 is provided overlying the second gate conductor portion 764. By extension, such silicide layer 768 can be formed overlying the entire unitary conductive pattern including the first gate conductor portion 660 (FIG. 6) and the tail conductor portion 670 as well, provided that edges, e.g., edge 776 of the conductive via 774 is appropriately spaced from edges 682 and 684 of the tail conductor portion 670, as shown in FIG. 6.

Figure 8:
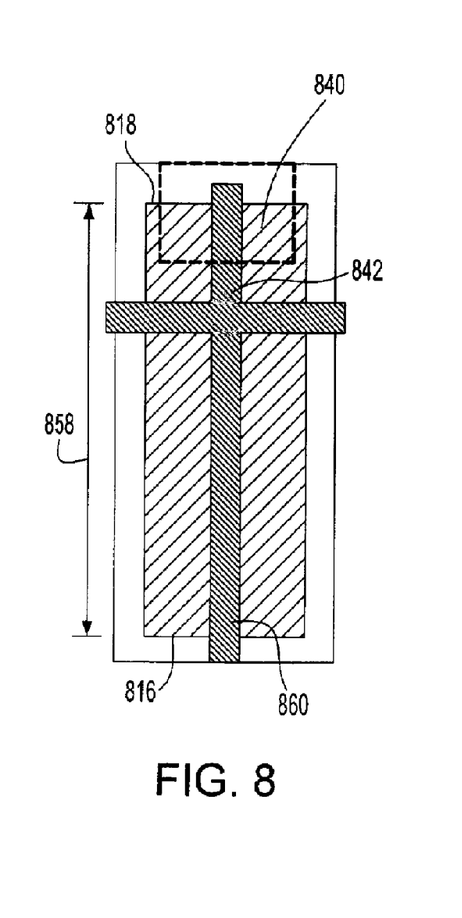
FIG. 8 is a top plan view illustrating a body-contacted SOI FET according to another embodiment of the present invention.

FIG. 8 illustrates a variation of the embodiments described above with reference to FIG. 6 and FIG. 7A or FIG. 7B. As shown therein, the unitary conductive pattern including the tail conductor portion 842 and the first gate conductor portion 860 extends the entire length 858 of the unitary single-crystal semiconductor region between a top edge 818 and a bottom edge 816 thereof. Depending on the placement of the conductive via relative to the body contact implant region 840, the conductive via can be formed in a borderless or bordered manner, similar to that described in FIGS. 7A and 7B.

Figure 9:
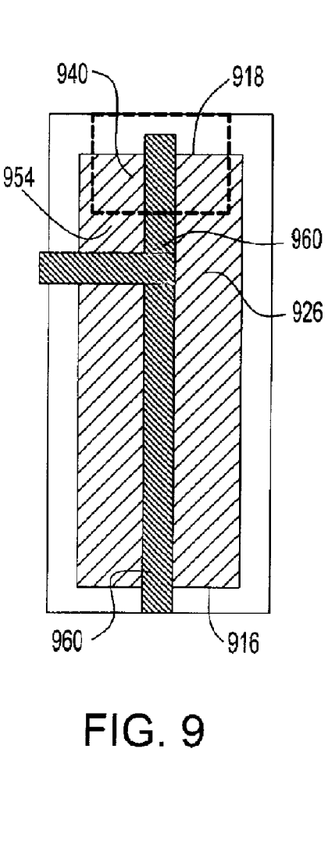
FIG. 9 is a top plan view illustrating a body-contacted SOI FET according to yet another embodiment of the present invention.

In a further embodiment shown in FIG. 9, one of the source region and the drain region of the first FET extends from the bottom edge 916 of the unitary single-crystal semiconductor region to the top edge 918 thereof. Preferably, it is the source region 926 that extends from the bottom edge 916 to the top edge 918. In this case, the body contact implant region 940 has junctions with both a portion of the source region 926 and the second diffusion region 954 that is disposed on a side opposite the first gate conductor portion 960 from the source region 926.

Figure 10:
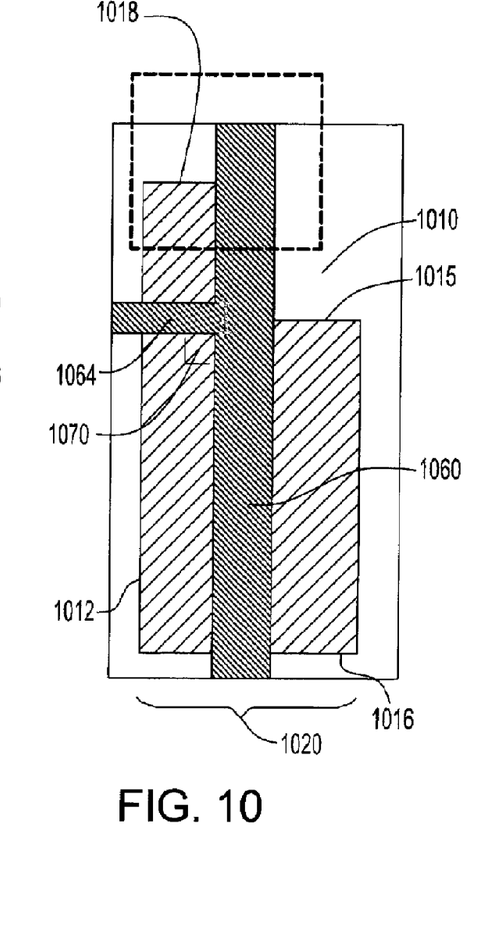
FIG. 10 is a top plan view illustrating a body-contacted SOI FET according to still another embodiment of the present invention.

Finally, FIG. 10 illustrates an embodiment similar to that shown in FIG. 9, but in which the unitary single-crystal semiconductor region has a notched appearance. Isolation regions, e.g., a shallow trench isolation ("STI") region 1010, occupy the area of the substrate surface surrounding the semiconductor region. This structure is appropriate for use where the gate conductor 1060 of the active first FET 1020 need not have the smallest linewidth for gate conductors of the integrated circuit. The linewidth of the gate conductor 1060 is substantially greater than the smallest linewidth. The larger linewidth of the gate conductor 1060 of the first FET 1020 is needed to assure that the edge of the STI region 1010 is overlapped by the gate conductor 1060 within the process tolerances provided for fabricating the first FET 1020. In this embodiment, either the source region or the drain region of the first FET 1020 extends only between a bottom edge 1016 of the single-crystal region and an intermediate edge 1015 that is disposed between the top and bottom edges. In addition, in this embodiment, the second gate conductor portion 1064 extends between only one edge, e.g., the left edge 1012 of the single-crystal semiconductor region and the first gate conductor portion 1060 of the first FET 1020, and meets the first gate conductor portion at a right angle 1070 or substantially at a right angle.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A semiconductor device structure comprising:
a unitary single-crystal semiconductor region of a substrate, the unitary single-crystal semiconductor region having an exposed horizontally extending major surface;
a first field effect transistor ("FET") having a first source region and a first drain region, the first source region and first drain region occupying a first source portion and a first drain portion, respectively, of the unitary single-crystal semiconductor region extending from the major surface, the first source region and the first drain region defining a first source-drain conduction path;
at least one second field effect transistor ("FET") having a second source-drain conduction path electrically in parallel with the first source-drain conduction path of the first FET, the at least one second FET having a second diffusion region occupying a second portion of the unitary single-crystal semiconductor region extending from the major surface, the second diffusion region including at least one of a second source region and a second drain region, the second source-drain conduction path extending between the second diffusion region and at least one of the first source region and the first drain region; and
a body contact region occupying a third portion of the unitary single-crystal semiconductor region extending from the major surface, the body contact region having a junction with the second diffusion region.

2. The semiconductor device structure as claimed in claim 1, wherein the first FET further includes a first channel region occupying a first channel portion of the unitary single-crystal semiconductor region and the second FET further includes a second channel region occupying a second channel portion of the unitary single-crystal semiconductor region, wherein the body contact region is conductively connected to the first channel region of the first FET and to the second channel region of the second FET.

3. The semiconductor device structure as claimed in claim 2, wherein the substrate is a semiconductor-on-insulator ("SOI") substrate, the SOI substrate including a buried oxide ("BOX") layer underlying the unitary single-crystal semiconductor region, and further including a bulk region underlying the BOX layer.

4. The semiconductor device structure as claimed in claim 2, further comprising a unitary horizontally extending conductive pattern having a first gate conductor portion overlying the first channel region and a second gate conductor portion conductively connected to the first gate conductor portion and extending horizontally from the first gate conductor portion, the second gate conductor portion overlying the second channel region, the first gate conductor portion defining a first gate conductor of the first FET and the second gate conductor portion defining a second gate conductor of the second FET.

5. The semiconductor device structure as claimed in claim 4, wherein the first gate conductor portion is oriented in a lengthwise direction of the unitary single-crystal semiconductor region and the second gate conductor portion is oriented substantially in a widthwise direction of the unitary single-crystal semiconductor region.

6. The semiconductor device structure as claimed in claim 5, wherein the second gate conductor portion extends entirely across a width of the unitary single-crystal semiconductor region, the first gate conductor portion is connected to a first edge of the second gate conductor portion and the unitary conductive pattern further includes a tail conductor portion extending from a second edge of the second gate conductor portion opposite from the first edge.

7. The semiconductor device structure as claimed in claim 6, wherein the tail conductor portion is oriented in the lengthwise direction.

8. An integrated circuit including the semiconductor device structure as claimed in claimed in claim 4, wherein the unitary conductive pattern has a linewidth not substantially greater than a predetermined smallest linewidth for gate conductors of the integrated circuit.

9. The semiconductor device structure as claimed in claim 4, wherein the unitary single-crystal semiconductor region has a bottom edge and a top edge bounding a maximum length in a lengthwise direction of the unitary single-crystal semiconductor region and has a left edge and a right edge bounding a width in a widthwise direction of the unitary single-crystal semiconductor region, wherein the first gate conductor portion extends in the lengthwise direction from the bottom edge to the top edge, and the second gate conductor portion extends from only one of the left edge or the right edge to the first gate conductor portion.

10. The semiconductor device structure as claimed in claim 9, wherein at least one of the first source region and the first drain region extends from the top edge to the bottom edge of the unitary single-crystal semiconductor region and the body contact region forms a junction with the at least one of the first source region and the first drain region.

11. The semiconductor device structure as claimed in claim 10, wherein the unitary single-crystal semiconductor region further includes an intermediate edge located between the top edge and the bottom edge, and the unitary single-crystal semiconductor region is notched, such that at least one of the first source region and the first drain region extends from one of the top edge and the bottom edge only to the intermediate edge, and the second gate conductor portion extends only between i) one of the left edge or the right edge, and ii) the first gate conductor portion.

12. The semiconductor device structure as claimed in claim 11, wherein the intermediate edge is bounded by a trench isolation region.

13. An integrated circuit including the semiconductor device structure as claimed in claim 12, wherein the first gate conductor portion has a width substantially greater than a smallest gate conductor linewidth of the integrated circuit.

14. A semiconductor device structure as claimed in claim 5, wherein the first gate conductor portion meets the second gate conductor portion substantially at right angles.

15. A semiconductor device structure as claimed in claim 1, further comprising a conductive via conductively contacting both the body contact region and the second diffusion region.

16. A semiconductor device structure as claimed in claim 4, wherein the second gate conductor portion extends entirely across a width of the unitary single-crystal semiconductor region to divide the first FET from the second diffusion region of the second FET and the unitary conductive pattern includes a tail portion extending from an edge of the second gate conductor portion towards one of a top edge or a bottom edge of the unitary single-crystal semiconductor region.

17. A method of fabricating a body-contacted semiconductor device structure, comprising:

providing a unitary single-crystal semiconductor region of a substrate, the unitary single-crystal semiconductor region having an exposed horizontally extending major surface and having a first conductivity type;

forming a unitary conductive pattern to mask first portions of the unitary single-crystal semiconductor region, the unitary conductive pattern including a first gate conductor portion and a second gate conductor portion extending at an angle from the first gate conductor portion;

implanting second portions of the unitary single-crystal semiconductor region not masked by the unitary conductive pattern to form a) a first source region and a first drain region for a first field effect transistor ("FET"), the first source region and first drain region defining a first source-drain conduction path, b) a second diffusion region for a second field effect transistor ("FET"), the second diffusion region having a second source-drain conduction path to at least one of the first source region and the first drain region, and c) a body contact region having a junction with the second diffusion region, the first source region, first drain region, second diffusion region and body contact region occupying respective portions of the unitary single-crystal semiconductor region, each of the portions being exposed at the major surface.

18. A method of fabricating an integrated circuit including the method as claimed in claim 17, wherein the first gate conductor portion and the second gate conductor portion each have a smallest predetermined linewidth for fabricating gate conductors of the integrated circuit.

* * * * *